United States Patent
Lee

(10) Patent No.: US 9,472,742 B2
(45) Date of Patent: Oct. 18, 2016

(54) LIGHT EMITTING DEVICE AND LIGHT UNIT HAVING THE SAME

(71) Applicant: LG INNOTEK CO., LTD., Seoul (KR)

(72) Inventor: Keon Hwa Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/673,501

(22) Filed: Mar. 30, 2015

(65) Prior Publication Data

US 2015/0349223 A1    Dec. 3, 2015

(30) Foreign Application Priority Data

May 28, 2014    (KR) .................. 10-2014-0064310

(51) Int. Cl.
  H01L 33/62    (2010.01)
  H01L 33/64    (2010.01)
  H01L 33/00    (2010.01)
  H01L 33/48    (2010.01)

(52) U.S. Cl.
  CPC ............ H01L 33/62 (2013.01); H01L 33/642 (2013.01); H01L 33/0079 (2013.01); H01L 33/486 (2013.01); H01L 2224/16225 (2013.01); H01L 2224/32225 (2013.01); H01L 2224/73204 (2013.01); H01L 2224/83101 (2013.01)

(58) Field of Classification Search
  CPC . H01L 33/62; H01L 33/642; H01L 33/0079; H01L 33/486
  See application file for complete search history.

(56) References Cited

U.S. PATENT DOCUMENTS

| 6,492,737 B1 | 12/2002 | Imasu et al. |
| 2002/0020927 A1 | 2/2002 | Akram et al. |
| 2002/0070400 A1 | 6/2002 | Shibuya et al. |
| 2004/0188696 A1 | 9/2004 | Hsing Chen et al. |
| 2008/0006837 A1* | 1/2008 | Park .................. H01L 25/167 257/98 |
| 2008/0308314 A1 | 12/2008 | Sasaki |
| 2009/0186431 A1 | 7/2009 | Tanaka et al. |
| 2011/0057209 A1 | 3/2011 | Kim |
| 2011/0057569 A1 | 3/2011 | Wei et al. |
| 2011/0114989 A1* | 5/2011 | Suehiro .................. H01L 33/54 257/99 |
| 2011/0169034 A1* | 7/2011 | Tseng .................... H01L 33/486 257/98 |
| 2011/0315956 A1 | 12/2011 | Tischler et al. |
| 2012/0261689 A1 | 10/2012 | Appelt et al. |
| 2013/0322081 A1* | 12/2013 | Pan ..................... H01L 25/0753 362/249.02 |
| 2014/0254151 A1* | 9/2014 | Kim ........................ F21V 29/74 362/235 |

FOREIGN PATENT DOCUMENTS

| DE | 10 2010 033 868 A1 | 2/2012 |
| EP | 2 704 223 A1 | 3/2014 |
| KR | 10-2010-0038937 A | 4/2010 |
| KR | 10-2011-0023322 A | 3/2011 |
| KR | 10-2012-0066652 A | 6/2012 |
| KR | 10-2013-0087518 A | 8/2013 |
| WO | 2012/019867 A1 | 2/2012 |

* cited by examiner

Primary Examiner — Peniel M Gumedzoe
(74) Attorney, Agent, or Firm — Birch, Stewart, Kolasch & Birch, LLP

(57) ABSTRACT

A light emitting device includes a support member having a body, first and second pads spaced apart from each other on the body and a depression in the body; a light emitting chip having a light emitting structure and third and fourth pads under the light emitting structure; and an adhesive member between the support member and the light emitting chip, wherein the third pad is electrically connected to the first pad, the fourth pad is electrically connected to the second pad, the light emitting structure includes a first conductive semiconductor layer, an active layer and a second conductive semiconductor layer, and a portion of the adhesive member is disposed in the depression.

22 Claims, 19 Drawing Sheets

LIGHT EMITTING DEVICE AND LIGHT UNIT HAVING THE SAME

This application claims priority under 35 U.S.C. §119 to Korean Patent Application No. 10-2014-0064310 filed on May 28, 2014, which is hereby incorporated by reference.

BACKGROUND OF THE INVENTION

1. Field of the Invention

The embodiments of the invention relate to a light emitting device and a light unit having the same.

2. Description of the Related Art

Light emitting devices, for example, light emitting diodes (LEDs) are semiconductor devices that convert electric energy into light and are extensively used as next-generation light sources in place of conventional fluorescent lamps and glow lamps.

Since the LED generates the light by using the semiconductor device, the LED may provide low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response characteristics, and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY OF THE INVENTION

The embodiments of the invention provide a light emitting device having a new light dissipation structure.

The embodiments of the invention provide a light emitting device having a new electric connection structure.

The embodiments of the invention provide a light emitting device in which a light emitting chip is bonded to a support member by a film-type adhesive member.

The embodiments of the invention can improve the electric reliability of a light emitting device and a light unit having the same.

A light emitting device according to the embodiment of the invention includes a support member having a body, first and second pads spaced apart from each other on the body, and a depression in the body; a light emitting chip having a light emitting structure and third and fourth pads under the light emitting structure; and an adhesive member between the support member and the light emitting chip, wherein the third pad is electrically connected to the first pad, the fourth pad is electrically connected to the second pad, the light emitting structure includes a first conductive semiconductor layer, an active layer and a second conductive semiconductor layer, and a portion of the adhesive member is disposed in the depression.

DETAILED DESCRIPTION OF THE EMBODIMENTS

Figure 1:
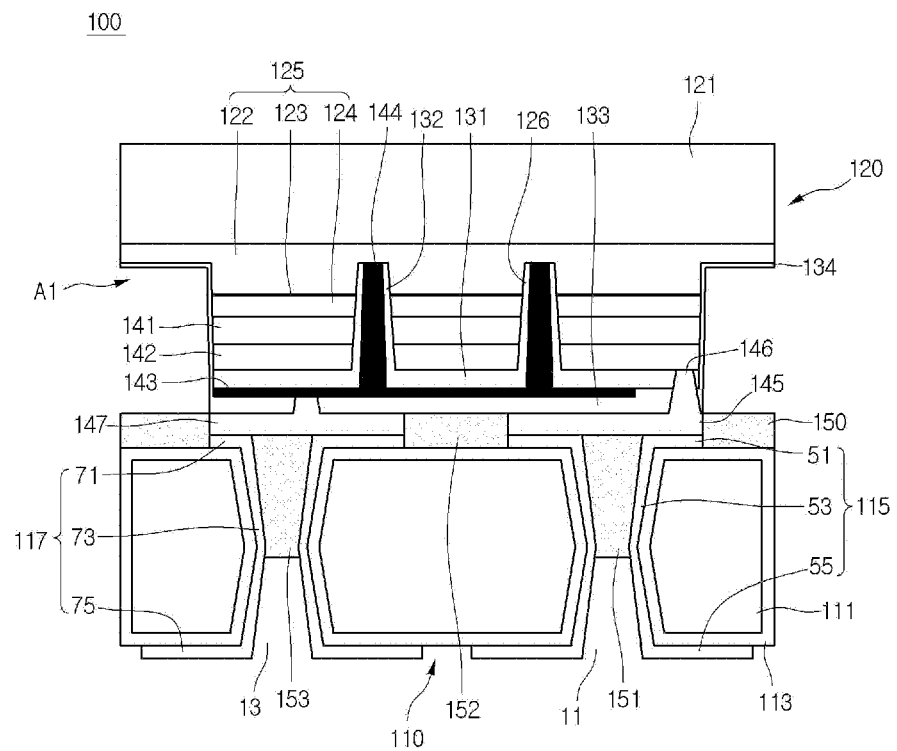
FIG. 1 is a side sectional view showing a light emitting device according to a first embodiment.

In the description of the embodiments of the invention, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings. In addition, the same reference numerals will refer to the same elements throughout the drawings.

Hereinafter, a light emitting device according to the embodiments of the invention will be described in detail with reference to accompanying drawings.

Figure 2:
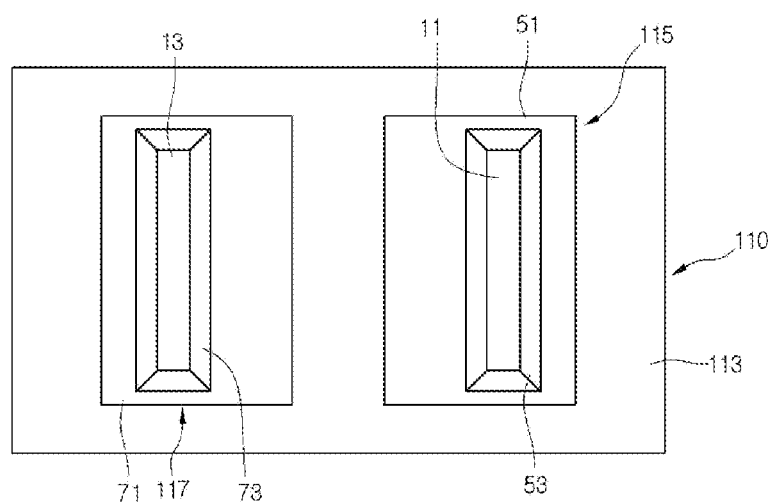
FIG. 2 is a plan view showing an example of a support member of a light emitting device shown in FIG. 1.
Figure 3:
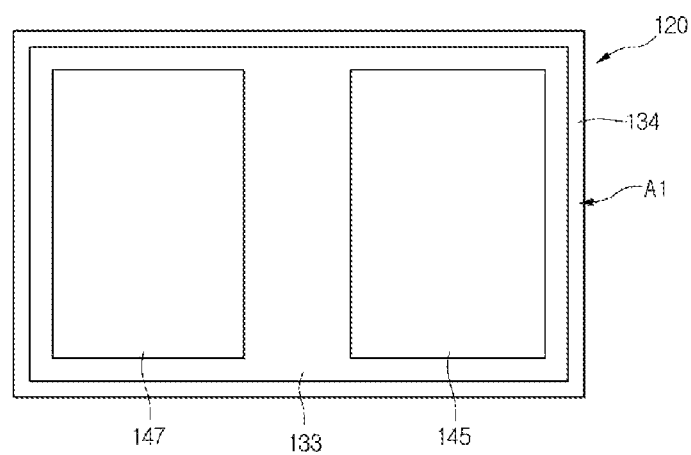
FIG. 3 is a plan view showing an example of a light emitting chip of a light emitting device shown in FIG. 1.

FIG. 1 is a side sectional view showing a light emitting device according to a first embodiment of the invention, FIG. 2 is a plan view showing a support member of the light emitting device shown in FIG. 1 and FIG. 3 is a plan view showing a light emitting chip of the light emitting device shown in FIG. 1.

Referring to FIGS. 1 to 3, the light emitting device 100 includes a support member 110, a light emitting chip 120 on the support member 110 and an adhesive member 150 between the support member 110 and the light emitting chip 120.

The support member 110 may include a body 111, for example, a conductive body. The conductive body 111 may include silicon and n-type impurity or p-type impurity may be doped into the conductive body 111. In another example, the body 111 may include an insulating body. For example, since the body 111 is formed of silicon having high thermal conductivity, heat generated from the light emitting chip 120 can be effectively dissipated. The support member 110 may have a thickness in the range of 180 μm to 210 μm. If the thickness of the support member 110 is less than the above range, the support member 110 may not serve as a supporter and heat dissipation efficiency may be lowered. If the thickness of the support member 110 exceeds the above range, a thickness of a device may be increased. Since the heat dissipation efficiency of the support member 10 can be improved, the light emitting chip 120 having a large area with high output can be employed.

As shown in FIGS. 1 and 2, the support member 110 may include a depression that is a concave portion in the support member. The depression may be in various forms, including a hole that goes completely through the support member 110, a recess or a void that is partially formed in the support member 110, a reservoir or a cavity formed in a portion of the support member 110, and a channel or a groove formed on a surface of the support member 110. In the embodiment of the invention shown in FIGS. 1 and 2, the depression is in the form of a plurality of holes 11 and 13. Thus, the support member 110 includes the plurality of holes 11 and 13, and pads 115 and 117. When the support member 110 includes the conductive body 111, a protective layer 113 may be disposed between the pads 115 and 117 and the conductive body 111. The protective layer 113 may be disposed on a surface of the conductive body 111 and extend to the holes 11 and 13. The protective layer 113 may include an insulating material, for instance, a silicon oxide layer or a silicon nitride layer and may be prepared as a single layer or a multiple layer.

The holes 11 and 13 may include a first hole 11 and a second hole 13 spaced apart from the first hole 11. One first hole 11 or a plurality of first holes 11 may be formed in the conductive body 111. One second hole 13 or a plurality of second holes 13 may be formed in the conductive body 111. The protective layer 113 may extend into the first and second holes 11 and 13. The first and second holes 11 and 13 may overlap with the light emitting chip 120 in the vertical direction. The first and second holes 11 and 13 may overlap with a light emitting structure 125 of the light emitting chip 120 in the vertical direction. The first and second holes 11 and 13 may not overlap with an edge portion of a substrate 121 of the light emitting chip 120 in the vertical direction.

The support member 110 may include a first pad 115 and a second pad 117 spaced apart from the first pad 115. The first pad 115 may include a first contact part 51 disposed on a top surface (or a first surface that face the light emitting chip 120) of the body 111, a first connection part 53 formed in the first hole 11 and a first bonding part 55 disposed on a bottom surface (or a second surface) of the body 111. The first contact part 51 may extend from an inside of the first hole 11 to the top surface of the body 111 and the first bonding part 55 may extend from the inside of the first hole 11 to the bottom surface of the body 111. The first connection part 53 may be disposed on the protective layer 113 in the first hole 11. The first hole 11 may include an open region which is formed by vertically passing through an interior of the support member 110.

The second pad 117 may include a second contact part 71 disposed on the top surface of the body 111, a second connection part 73 formed in the second hole 13 and a second bonding part 75 disposed on the bottom surface of the body 111. The second contact part 71 may extend from an inside of the second hole 13 to the top surface of the body 111 and the second bonding part 75 may extend from the inside of the second hole 13 to the bottom surface of the body 111. The second connection part 73 may be disposed between the second hole 13 and the protective layer 113. The second hole 13 may include an open region which is formed by vertically passing through an interior of the support member 110.

A width of the first and second holes 11 and 13 may become gradually narrow closer to the direction of the center of the body 111 than the top and bottom surfaces of the body 111. The center of the body 111 is disposed between the top and bottom surfaces of the body 111. An upper width of the first and second holes 11 and 13 may be larger than a width of a center region of the body 111. A lower width of the first and second holes 11 and 13 may be larger than the width of the center region of the body 111. When viewed from the top, the first and second holes 11 and 13 may have polygonal shapes as shown in FIG. 2. In another example, the first and second holes 11 and 13 may have circular shapes or oval shapes. In another example, the first and second holes 11 and 13 may have the same width from the upper portion to the lower portion thereof. Accordingly, when viewed in side elevation of FIG. 1, the holes 11 and 13 are narrowest at the middle portion thereof, but such a structure is not required, and the holes 11 and 13 may be the narrowest at either a top end, bottom end, or both. In embodiments of the invention, in interior walls of the holes 11 and 13, formed thereon may be protrusion or surface roughness that extends perpendicular to surfaces of the interior walls.

The first and second pads 115 and 117 may be formed of metallic materials. For instance, the first and second pads 115 and 117 may include at least one of Ti, Cu, Ni, Au, Cr, Ta, Pt, Sn, Ag, P and an alloy thereof and may be prepared in the form of a single layer or a multiple layer.

The light emitting chip 120 is disposed on the support member 110 and may include the light emitting structure 125 having a plurality of semiconductor layers and a plurality of pads 145 and 147. The semiconductor layers may be realized by using groups II to VI compound semiconductors, for instance, a group III-V compound semiconductor or a group II-VI compound semiconductor. The pads 145 and 147 may be selectively connected to the semiconductor layer of the light emitting structure 125 in order to supply power.

The light emitting structure 125 may include a first conductive semiconductor layer 122, an active layer 123 and a second conductive semiconductor layer 124. The first conductive semiconductor layer 122 may include a group III-V compound semiconductor doped with a first conductive dopant, such as one selected from the group consisting of GaN, AlN, AlGaN, InGaN, InN, InAlGaN, AlInN, AlGaAs, GaP, GaAs, GaAsP, and AlGaInP. If the first conducive type is an n-type semiconductor, the first conductive dopant may include an n-type dopant, such as Si, Ge, Sn, Se, or Te. The first conductive semiconductor layer 122 may be prepared as a single layer or a multiple layer, and the embodiment of the invention is not limited thereto.

The active layer 123 is disposed under the first conductive semiconductor layer 122 and may have one of a single quantum well structure, a multi-quantum well structure, a quantum dot structure, and a quantum wire structure. The active layer 123 may be formed in a cycle of well/barrier layers by using a group III-V compound semiconductor. For instance, the active layer 123 may be formed in a cycle of InGaN/GaN, InGaN/InGaN, InGaN/InAlGaN or InGaN/AlGaN. A conductive clad layer may be formed on and/or under the active layer 123. The conductive clad layer may be formed of an AlGaN semiconductor. The second conductive semiconductor layer 124 is disposed under the active layer 123 and may include a group III-V compound semiconductor doped with a second conductive dopant, such as one selected from the group consisting of GaN, AlN, AlGaN, InGaN, InN, InAlGaN, AlInN, AlGaAs, GaP, GaAs, GaAsP, and AlGaInP. If the second conducive type is a p-type semiconductor, the second conductive dopant may include a p-type dopant, such as Mg or Ze. The second conductive semiconductor layer 124 may be prepared as a single layer or a multiple layer, and the embodiment of the invention is not limited thereto.

For example, the light emitting structure 125 may have at least one of an NP junction structure, a PN junction structure, an NPN junction structure, and a PNP junction structure due to the stack structure of semiconductor layers.

As shown in FIGS. 1 and 3, the pads 145 and 147 of the light emitting chip 120 may include a third pad 145 and a fourth pad 147 which are spaced apart from each other under the light emitting chip 120. The third pad 145 is electrically connected to the second conductive semiconductor layer 124 and the fourth pad 147 is electrically connected to the first conductive semiconductor layer 122. When viewed from the bottom, the third and fourth pads 145 and 147 may have polygonal shapes. For instance, the third and fourth pads 145 and 147 may have shapes corresponding to shapes of the first and second pads 115 and 117. A bottom area of the third and fourth pads 145 and 147 may correspond to a size of top surfaces of the second pads 115 and 117.

The light emitting chip 120 may include a substrate 121. The substrate 121 is disposed on the light emitting structure 125. For instance, the substrate 121 may be a transparent substrate, an insulating substrate or a conductive substrate. That is, the substrate 121 may include the transparent substrate, the insulating substrate or the conductive substrate. The substrate 121 may include one selected from the group consisting of $Al_2O_3$, GaN, SiC, ZnO, Si, GaP, InP, $Ga_2O_3$, and GaAs. The substrate 121 may be a growth substrate.

The light emitting chip 120 may include at least one of a buffer layer and an undoped semiconductor layer between the substrate 121 and the light emitting structure 125. The buffer layer may attenuate the lattice mismatch between the substrate 121 and the semiconductor layer and may be formed by selectively using groups II to VI compound semiconductors. An undoped group III-V compound semiconductor layer may be additionally formed under the buffer layer, but the embodiment of the invention is not limited thereto.

The light emitting chip 120 may include electrode layers 141 and 142, a connection layer 143 and insulating layers 131 and 133 disposed under the light emitting structure 125. The electrode layers 141 and 142 may be formed as a single layer or a multiple layer and may serve as a current spreading layer. For example, if the electrode layers 141 and 142 are formed as a multiple layer, the electrode layers 141 and 142 may include a first electrode layer 141 disposed under the light emitting structure 125 and a second electrode layer 142 disposed under the first electrode layer 141.

The first and second electrode layers 141 and 142 may be formed by using mutually different materials. The first electrode layer 141 may be formed of a transparent material, such as metal oxide or metal nitride. For instance, the first electrode layer 141 may include one selected from the group consisting of ITO (indium tin oxide), ITON (ITO nitride), IZO (indium zinc oxide), IZON (IZO nitride), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide). The second electrode layer 142 makes contact with a bottom surface of the first electrode layer 141 and may serve as a reflective electrode layer. The second electrode layer 142 may include a metal having high reflectivity of 80% or above, such as AG, Au or Al. When the first electrode layer 141 has an open region, the second electrode layer 142 may partially make contact with a bottom surface of the light emitting structure 125, for instance, a bottom surface of the second conductive semiconductor layer 124.

In another example, the electrode layers 141 and 142 may be stacked in an ODR (Omnidirectional reflector layer) structure. The ODR structure may have a stack structure including the first electrode layer 141 having a low refractive index and the second electrode layer 142 making contact with the first electrode layer 141 and having a high reflective metallic material. For instance, the electrode layers 141 and 142 may have a stack structure of ITO/Ag. Thus, an omnidirectional reflecting angle can be improved at an interfacial surface between the first electrode layer 141 and the second electrode layer 142.

According to another example, the second electrode layer 142 may be omitted and a reflective layer having hetero materials can be formed. The reflective layer may have a DBR (Distributed Bragg Reflector) structure where two dielectric layers having mutually different refractive indexes are alternately disposed. For instance, the two dielectric layers may selectively include one and different one of a $SiO_2$ layer, a $Si_3N_4$ layer, a $TiO_2$ layer, an $Al_2O_3$ layer, and an MgO layer, respectively. In another example, the electrode layers 141 and 142 or the reflective layer may include both of the DBR structure and the ODR structure. In this instance, the light emitting chip 120 may have light reflectivity of 98% or above.

The connection layer 143 is disposed under the second electrode layer 142 and electrically insulated from the first and second electrode layers 141 and 142. For example, the connection layer 143 may include a metal including at least one of Ti, Cu, Ni, Au, Cr, Ta, Pt, Sn, Ag, and P. The third and fourth pads 145 and 147 are disposed under the connection layer 143. The insulating layers 131 and 133 may block the undesired contact among the electrode layers 141 and 142, the connection layer 143, the third and fourth pads 145 and 147 and the light emitting structure 125. The insulating layers 131 and 133 may include first and second insulating layers 131 and 133. The first insulating layer 131 may be disposed between the connection layer 143 and the second electrode layer 142. The second insulating layer 133 may be disposed between the connection layer 143 and the third and fourth pads 145 and 147. The third and fourth pads 145 and 147 may include materials the same as materials for the first and second pads 115 and 117.

The connection layer 143 is connected to the first conductive semiconductor layer 122. A portion 144 of the connection layer 143 makes contact with the first conductive semiconductor layer 122 through a via structure (126) formed in the electrode layers 141 and 142 and the light emitting structure 125. The first insulating layer 131 includes portions 132, which extend to a periphery of one or more protrusions of the portion 144 to block the undesired contact among the electrode layers 141 and 142, the second conductive semiconductor layer 124 and the active layer 123. The one or more protrusions of the portion 144 of the connection layer 143 may protrude toward the substrate 121.

Under the second insulating layer 133, the third pad 145 is connected to or makes contact with at least one of the first and second electrode layers 141 and 142 through an open region of the second insulating layer 133. Under the second insulating layer 133, the fourth pad 147 is connected to the connection layer 143 through the open region of the second insulating layer 133. Thus, a protrusion 146 of the third pad 145 may be electrically connected to the second conductive semiconductor layer 124 through the electrode layers 141 and 142 and a protrusion 148 of the fourth pad 147 may be electrically connected to the first conductive semiconductor layer 122 through the connection layer 143.

The third and fourth pads 145 and 147 are spaced apart from each other under the light emitting chip 120 and face the first and second pads 115 and 117 of the support member 110.

Since a portion 134 of the second insulating layer 133 is formed at a lateral side of the light emitting structure 125 of the light emitting chip 120, an outer side of the light emitting structure 125 can be protected. In addition, an outer region of the first conductive semiconductor layer 122 of the light emitting structure 125 may have a step structure A1 where a width of a bottom surface is narrower than a width of a top surface of the first conductive semiconductor layer 122.

The adhesive member 150 may include a conductive film, for instance, a thermal conductive film. The thermal conductive film may include at least one of polyester resin including polyethylene terephthalate, polybutylene terephthalate, polyethylene naphthalate, and polybutylene naphthalate; polyimide resin; acrylic resin; styrene-based resin including polystyrene or acrylonitrile; polycarbonate resin; polylactic acid resin; and polyurethane resin. Further, the thermal conductive film may include at least one of polyolefin resin including polyethylene, polypropylene, or ethylene-propylene copolymer; vinyl resin including polyvinyl chloride or polyvinylidene chloride; polyamide resin; sulfone-based resin; polyether-ether ketone-based resin; arylate-based resin; and a blend of the above resins. For example, the adhesive member 150 may include a polyethylene terephthalate (PET) film. An adhesive composition may be applied to both sides of the adhesive member 150, but the embodiment of the invention is not limited thereto.

The adhesive member 150 has a thickness in the range of 2 μm to 25 μm. A portion 152 of the adhesive member 150 is disposed in a region among the first to fourth pads 115, 117, 145 and 147 and is bonded between the protective layer 113 and the second insulating layer 133. An outer region of the adhesive member 150 is disposed on an outer top surface of the support member 110 and may overlap with a top surface of the first conductive semiconductor layer 122 in the vertical direction. The outer region of the adhesive member 150 may be disposed in a region that does not overlap with the active layer 123 in the vertical direction.

The adhesive member 150 may include protrusions 151 and 153, which are disposed in at least one of the first and second holes 11 and 13. For instance, the protrusions 151 and 153 are disposed in the first and second holes 11 and 13, respectively. The protrusions 151 and 153 may have a length or a height smaller than a height or a depth of the first and second holes 11 and 13. The protrusions 151 and 153 may have a height smaller than a thickness of the support member 150. The protrusions 151 and 153 disposed in the first and second holes 11 and 13 may come into contact with the third and fourth pads 145 and 147 of the light emitting chip 120. The protrusions 151 and 153 may overlap with the light emitting chip 120 in the vertical direction. The protrusions 151 and 153 may overlap with the third and fourth pads 145 and 147 in the vertical direction. The protrusions 151 and 153 may be configured to have a wider width upper region than that of lower region thereof, but the embodiment of the invention is not limited thereto. The protrusions 151 and 153 may be spaced apart from each other in the support member 110.

The bonding layer may be provided in the region between the first and third pads 115 and 145 and between the second and fourth pads 117 and 147. The bonding layer may include Au/Sn, Ni/Cu, Pb/Sn, Au/Ge, Au/Sn/Ge, Au/Pb/Sn, and Cu/Pb/Sn.

An outer portion of the adhesive member 150 may be disposed outward as compared with a lateral side of the light emitting structure 125. The outer portion of the adhesive member 150 may be disposed at an outside of the third and fourth pads 145 and 147. A top surface of the outer portion of the adhesive member 150 may be lower than a bottom surface of the light emitting structure 125. The outer portion of the adhesive member 150 may overlap with an outer portion of the substrate 121 in the vertical direction. A transparent layer may be disposed in a region between the outer portion of the adhesive member 150 and the top surface of the first conductive semiconductor layer 122 and the transparent layer may include air or resin material. The transparent layer may have a thickness larger than a thickness of the active layer 123.

The adhesive member 150 according to the embodiment of the invention is bonded between the support member 110 having the body 111 of silicon material and the light emitting chip 120 and may serve as a thermal conductive member, so that heat generated from the light emitting chip 120 can be effectively conducted or dissipated.

In addition, the light emitting chip 120 can emit the light through a surface of the substrate 121 and a lateral side of the light emitting structure 125 so that the light extraction efficiency can be improved. Further, since there is no reflective cup around the light emitting chip 120, the light can be emitted with wide orientation angle.

According to the embodiment of the invention, an area of a bottom surface of the light emitting chip 120 may be narrower than an area of a top surface of the support member 110. In addition, a space may be provided in the support member 110 to allow the adhesive member 150 to partially move in the support member 110 during the bonding process. Further, in the support member 110, a space for the adhesive member 150 may be provided at outer regions of the first to fourth pads 115, 117, 145 and 147 for the bonding process.

In this instance, the light emitting chip 120 can be directly bonded onto the support member 110, so that the bonding process can be simplified. In addition, the heat dissipation efficiency of the light emitting chip 120 can be improved, so that the light emitting chip 120 can be usefully employed in the field of lighting.

Figure 4:
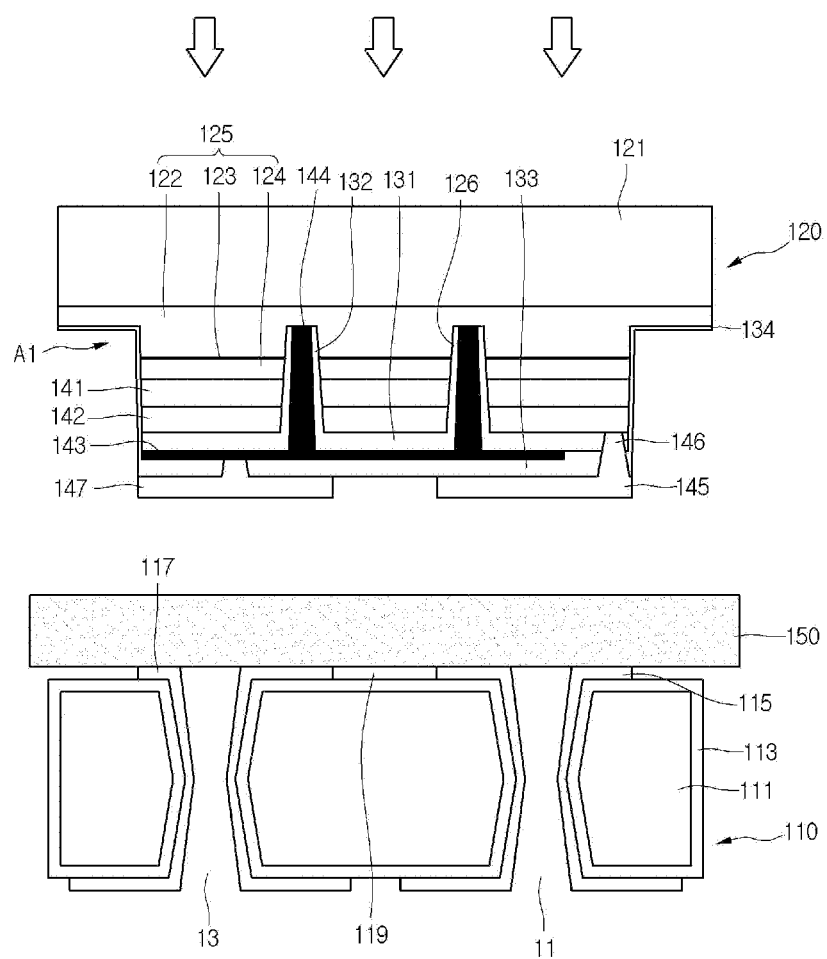
FIG. 4 is a view showing a manufacturing process of a light emitting device shown in FIG. 1.

Hereinafter, the manufacturing process for the light emitting device will be described with reference to FIG. 4. After the adhesive member 150 is disposed on the support member 110, the light emitting chip 120 is thermally pressed toward the support member 110. As a result, as shown in FIG. 1, the third pad 145 and the fourth pad 147 of the light emitting chip 120 make contact with the first pad 115 and the second pad 117 of the support member 110 and the third pad 145 and the fourth pad 147 of the light emitting chip 120 are thermally bonded to the first pad 115 and the second pad 117 of the support member 110. In this instance, the adhesive member 150 is moved while being pushed from the interfacial surface between the first and third pads 115 and 145 and the interfacial surface between the second and fourth pads 117 and 147, so that the adhesive member 150 is introduced into the first and second holes 11 and 13 of the support member 110. In addition, a portion of the adhesive member 150 is moved into an outer region of the light emitting chip 120 and a region among the pads 115, 117, 145 and 147. As the adhesive member 150 is cured, the adhesive member 150 disposed in the first and second holes 11 and 13 of the support member 110 may form the protrusion.

The adhesive member 150 has the thickness in the range of 20 μm to 25 μm before the pressing process and is completely removed from the interfacial surface among the pads 115, 117, 145 and 147 after the pressing process. In this instance, a space for receiving the adhesive member 150 is necessary at the region adjacent to the pads 115, 117, 145 and 147. If there is no space for the adhesive member 150 at the region adjacent to the pads 115, 117, 145 and 147 during the thermal pressing process, the adhesive member 150 may not be completely removed from the interfacial surface among the pads 115, 117, 145 and 147. In this instance, incomplete contact may occur at the interfacial surface among the pads 115, 117, 145 and 147, causing electric contact failure. According to the embodiment of the invention, the holes 11 and 13 are formed in correspondence with the adhesive member 150 at the region adjacent to or overlapping with the pads 115, 117, 145 and 147, so that the holes 11 and 13 may serve as a receiving space for the adhesive member 150 during the thermal pressing process for the adhesive member 150. A portion of the adhesive member 150 may move into a space between the support member 110 and the light emitting chip or an outer region.

As the adhesive member 150 is cured, the light emitting chip 120 is bonded to the support member 110, so the light emitting chip 120 may be cut into a package size or may be used for a lighting module. Although the embodiment of the invention has been described in that one light emitting chip 120 is mounted on the support member 110, at least two light emitting chips 120, which are spaced part from each other by a predetermined distance, can be arranged on the support member 110.

Figure 5A:
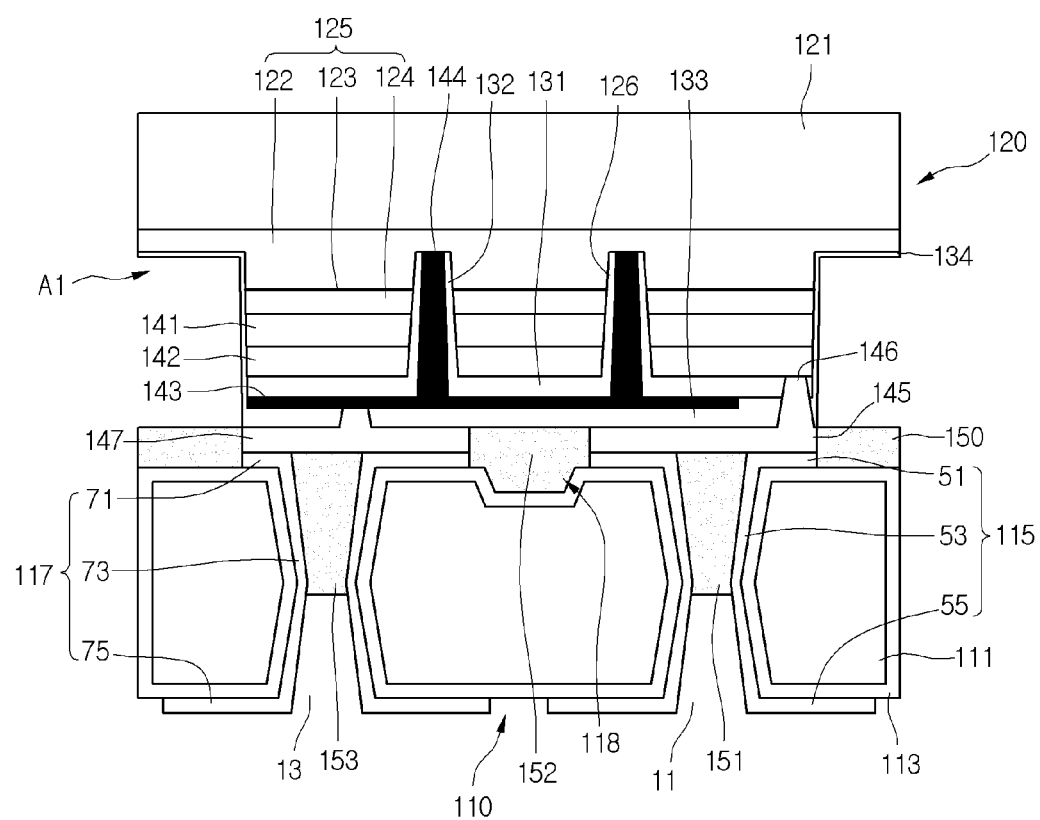
FIG. 5A is a side sectional view showing a light emitting device according to a second embodiment.
Figure 5B:
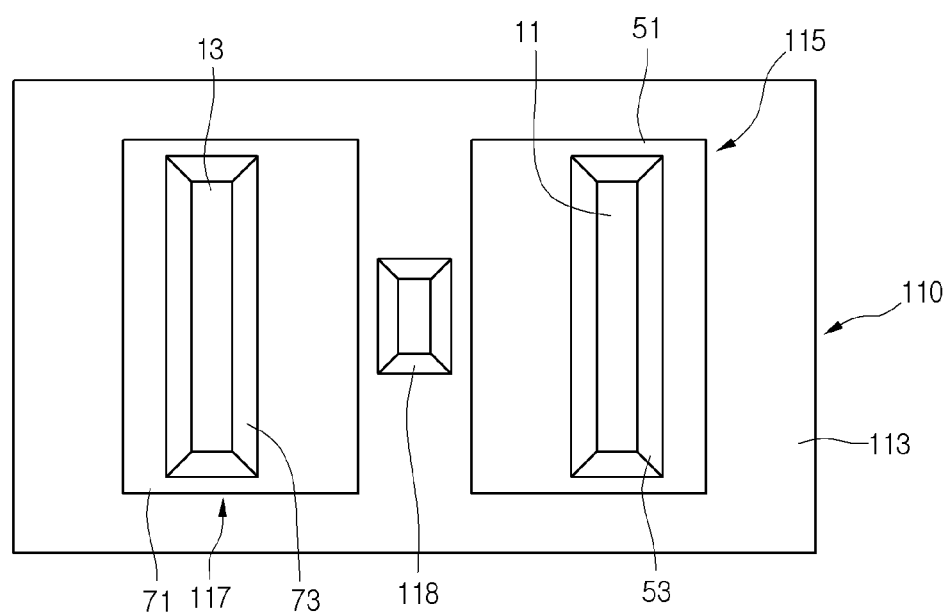
FIG. 5B is a plan view showing an example of a support member shown in FIG. 5A.

FIG. 5A is a side sectional view showing a light emitting device according to a second embodiment of the invention, and FIG. 5B is a plan view showing a support member shown in FIG. 5A. In the following description of FIGS. 5A and 5B, the first embodiment of the invention will be incorporated by references for the same parts.

Referring to FIG. 5A, the light emitting device includes a support member 110, a light emitting chip 120 on the support member 110 and an adhesive member 150 between the support member 110 and the light emitting chip 120.

As shown in FIGS. 5A and 5B, a first recess 118 may be formed at an upper portion of the support member 110 at a region adjacent to at least one of the first and second holes 11 and 31 and the first recess 118 is recessed downward from a top surface of the body 111. A protective layer 113 may be formed in the first recess 118, and the embodiment of the invention is not limited thereto. The first recess 118 may be disposed between the first and second pads 115 and 117 of the support member 110. The first recess 118 may be disposed adjacent to at least one of a first contact part 51 of the first pad 115 and a second contact part 71 of the second pad 117. In addition, at least one of the first contact part 51 of the first pad 115 and the second contact part 71 of the second pad 117 may extend to a surface of the protective layer 113 formed in the first recess 118. As shown in FIG. 5A, an upper width of the first recess 118 may be narrower than a gap between the first and second contact parts 51 and 71. As shown in FIG. 5B, a length of the first recess 118 may be shorter or longer than a length of the first and second contact parts 51 and 71. Referring to FIG. 5B, a width direction of the first recess 118 may be a transverse direction and a length direction of the first recess 118 may be a longitudinal direction.

According to another example, the first recess 118 may be located at the other position. For instance, the first recess 118 may be located between the first pad 115 and an upper edge of the support member 110 or between the second pad 117 and the upper edge of the support member 110. A plurality of first recesses 118 may be disposed around the first and second pads 115 and 117, and the embodiment of the invention is not limited thereto. A portion 152 of the adhesive member 150 may be inserted into the first recess 118, but the embodiment of the invention is not limited thereto. One or plural first recesses 118 are disposed around the first and second pads 115 and 117 when the adhesive member 150 is thermally pressed, so that the adhesive member 150 can be effectively received in the first recesses 118 as the adhesive member 150 is moved during the thermal pressing process.

The first recess 118 may have a depth smaller than a thickness of the body 111. A bottom of the first recess 118 may be located lower than bottom surfaces of the protrusions 151 and 153.

Figure 6:
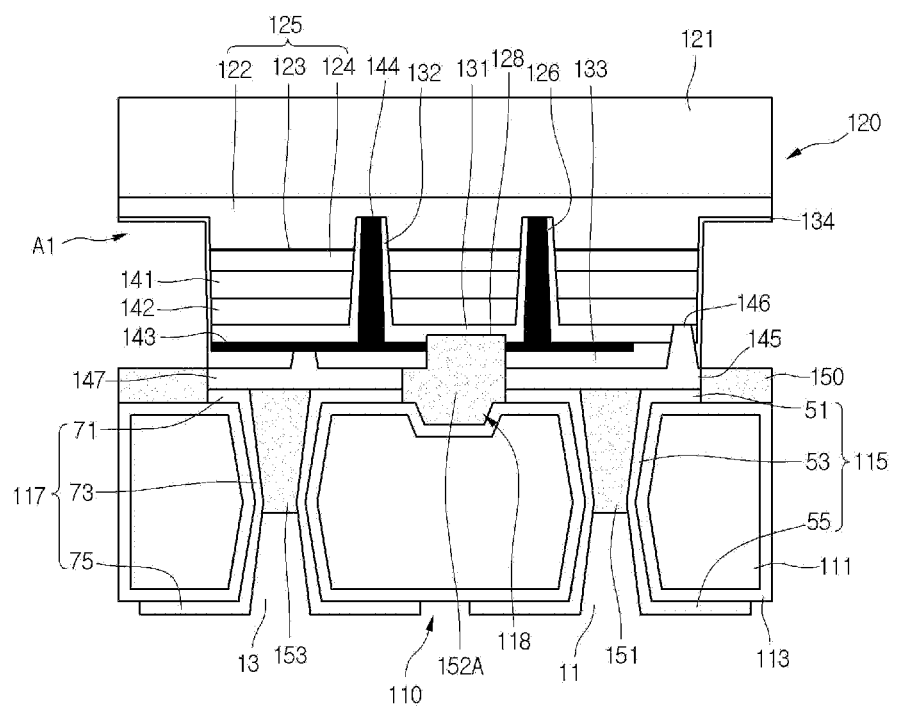
FIG. 6 is a side sectional view showing a light emitting device according to a third embodiment.

FIG. 6 is a side sectional view showing a light emitting device according to a third embodiment. In the following description of FIG. 6, the description of FIGS. 1, 5A and 5B will be incorporated by references for the same parts.

Referring to FIG. 6, the light emitting device includes a support member 110, a light emitting chip 120 on the support member 110 and an adhesive member 150 between the support member 110 and the light emitting chip 120.

The support member 110 includes a first recess 118 formed in the body 111 and the light emitting chip 120 includes a second recess 128 recessed toward a top surface of the substrate 121 or the light emitting structure 125. The first recess 118 may overlap with the second recess 128 in the vertical direction. In another example, the first recess 118 may be offset from the second recess 128 in the vertical direction or may not overlap with the second recess 128 in the vertical direction.

One or a plurality of second recesses 128 may be disposed at a region between the first and second pads 115 and 117 of the light emitting chip 120. The second recess 128 may be configured to correspond to an exposure depth of the first insulating layer 131. In another example, the second recess 128 may be configured to correspond to an exposure depth of at least one of the second electrode layer 142, the connection layer 143 and the first insulating layer 131. That is, the second recess 128 may be configured to correspond to an exposure depth of the second electrode layer 142, the connection layer 143 or the first insulating layer 131 from the second insulating layer 133. The second recess 128 may be formed through the second insulating layer 133, the connection layer 143 and a part of the first insulating layer 131. A portion 152A of the adhesive member 110 may be disposed in the second recess 128 and the first recess 118.

The second recess 128 may have a predetermined depth from a bottom surface of the second insulating layer 133 and the depth of the second recess 128 may be lower than the depth of the first recess 118.

The adhesive member 150 may be filled in the first and second recesses 118 and 128. For instance, as the adhesive member 150 disposed between the light emitting chip 120 and the support member 110 is pressed, the adhesive member 150 is moved to fill the first and second recesses 118 and 128.

Figure 7:
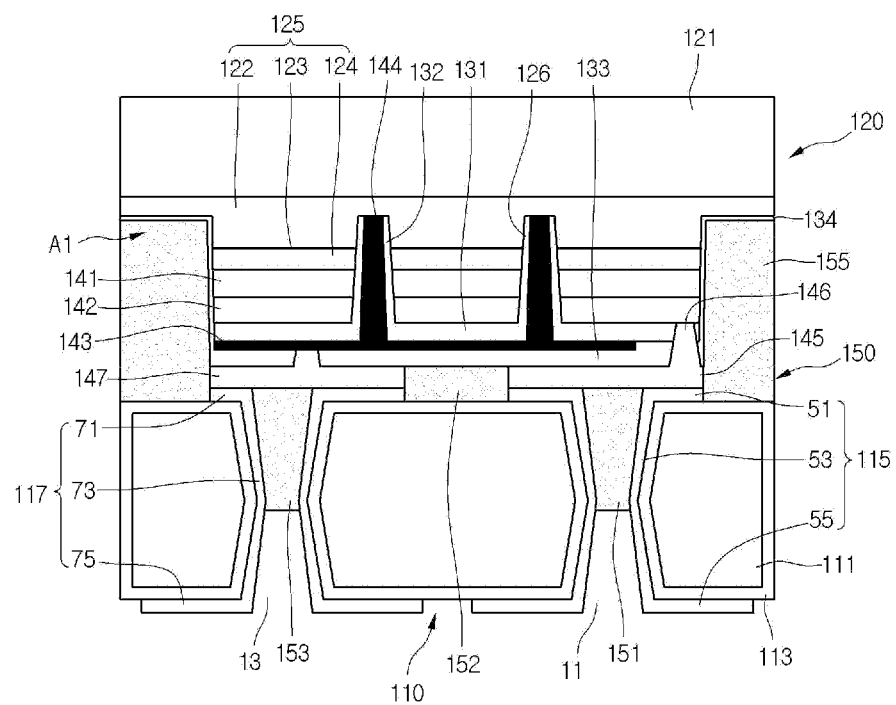
FIG. 7 is a side sectional view showing a light emitting device according to a fourth embodiment.

FIG. 7 is a side sectional view showing a light emitting device according to a fourth embodiment. In the following description of FIG. 7, the description of FIG. 1 will be incorporated by references for the same parts.

Referring to FIG. 7, the light emitting device includes a support member 110, a light emitting chip 120 on the support member 110 and an adhesive member 150 between the support member 110 and the light emitting chip 120.

An outer portion 155 of the adhesive member 150 may extend outward of the light emitting structure 125. The outer portion 155 of the adhesive member 150 may come into contact with a portion 134 of the second insulating layer 133 disposed at an outer surface of the light emitting structure 125. A top surface of the outer portion 155 of the adhesive member 150 may be located lower than a top surface of the first conductive semiconductor layer 122 and higher than a bottom surface of the first conductive semiconductor layer 122. The outer portion 155 of the adhesive member 150 and the portion 134 of the second insulating layer 133 may be deposited on the outer surface of the light emitting structure 125 so that moisture may be prevented from penetrating into the outer surface of the light emitting structure 125. In another example, the portion 134 of the second insulating layer 133 disposed at the outer surface of the light emitting structure 125 may be removed. In this instance, the outer portion 155 of the adhesive member 150 may be bonded to the outer surface of the light emitting structure 125, that is, the outer surfaces of the second conductive semiconductor layer 124, the active layer 123 and the first conductive semiconductor layer 122.

According to the fourth embodiment of the invention, the adhesive member 150 may be bonded between the light emitting chip 120 and the support member 110 and the outer portion 155 of the adhesive member 150 may be bonded between the outer region of the light emitting chip 120 and the support member. Since the adhesive member 150 is filled in the outer region of the light emitting chip 120, the adhesive member 150 may be prevented from protruding outward of the support member 110.

Figure 8:
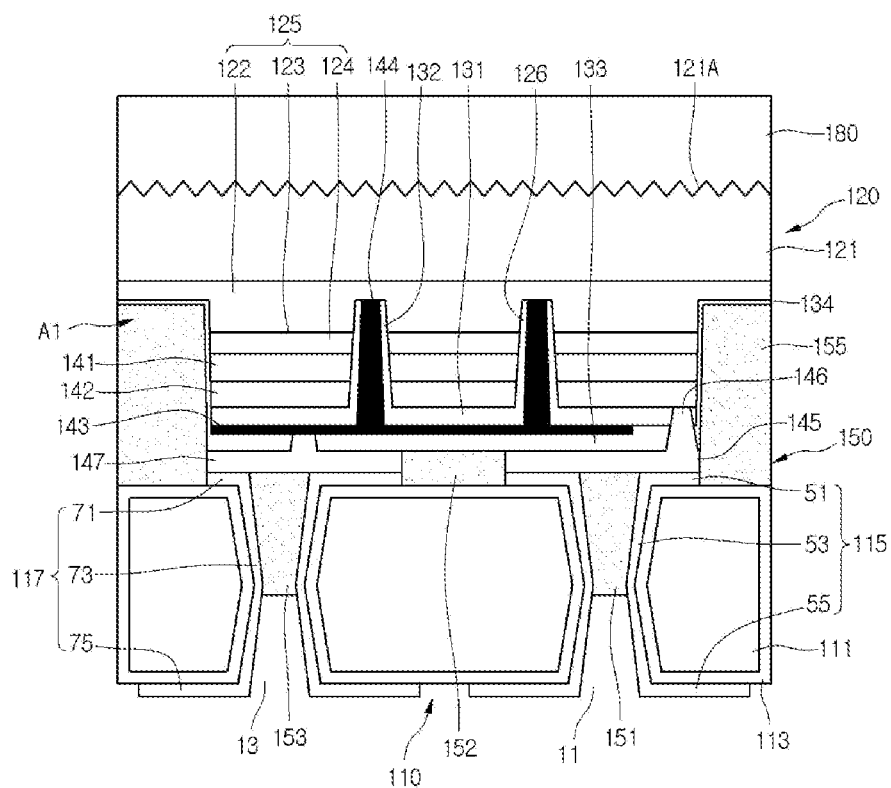
FIG. 8 is a side sectional view showing a light emitting device according to a fifth embodiment.

FIG. 8 is a side sectional view showing a light emitting device according to a fifth embodiment. In the following description of FIG. 8, the description of FIG. 7 will be incorporated by references for the same parts.

Referring to FIG. 8, the light emitting device includes a support member 110, a light emitting chip 120 on the support member 110 and an adhesive member 150 between the support member 110 and the light emitting chip 120.

The light emitting chip 120 may include a light emitting structure 125 and a substrate 121 and a roughness pattern 121A may be formed on the top surface of the substrate 121. The roughness pattern 121A may change a critical angle of light passing through the substrate 121, so that the light extraction efficiency can be improved.

A resin layer 180 may be formed on the substrate 121. The resin layer 180 may be prepared as a single layer or a multiple layer. The resin layer 180 may include a phosphor that converts the wavelength of light emitted from the light emitting chip 120. The resin layer 180 may include a transparent layer having no impurity such as the phosphor, or may have a stack structure of a transparent layer and a phosphor layer.

A lens having a curvature may be coupled onto the resin layer 180, but the embodiment of the invention is not limited thereto.

Figure 9:
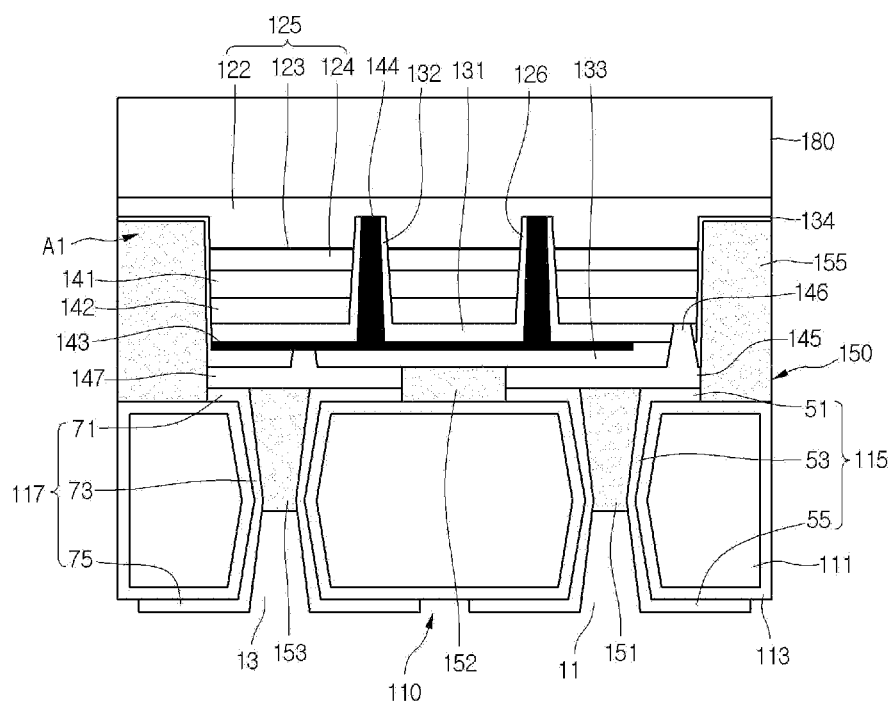
FIG. 9 is a view showing another example of a light emitting device shown in FIG. 7.

FIG. 9 is a view showing another example of a light emitting device shown in FIG. 7.

Referring to FIG. 9, the light emitting device includes a support member 110, a light emitting chip 120 on the support member 110 and an adhesive member 150 between the support member 110 and the light emitting chip 120.

The light emitting chip 120 may be obtained by removing the substrate 121 formed on the light emitting structure 125 of FIG. 7. The substrate 121 may be removed through a physical scheme or a chemical scheme. For instance, the substrate 121 may be removed by irradiating laser beams or by performing a wet etching.

As the substrate 121 is removed, a surface of the light emitting structure 125, that is, a top surface of the first conductive semiconductor layer 122 may be exposed. The top surface of the first conductive semiconductor layer 122 may be formed with a roughness pattern, but the embodiment of the invention is not limited thereto. In another example, a buffer layer or an undoped semiconductor layer may be exposed at a region where the substrate 121 has been removed. The buffer layer or the undoped semiconductor layer may be disposed on the light emitting structure 125.

A transparent resin layer 180 may be disposed on the light emitting structure 125. The transparent resin layer 180 may be prepared as a single layer or a multiple layer and may include a phosphor if necessary. In addition, a lens having a curvature may be coupled onto the transparent resin layer 180, but the embodiment of the invention is not limited thereto.

Figure 10:
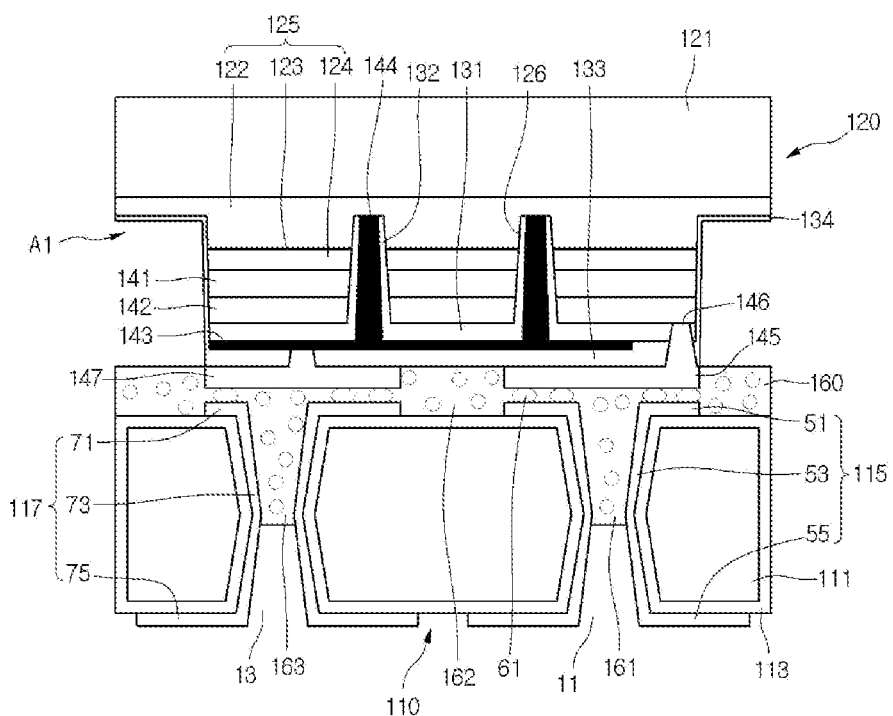
FIG. 10 is a side sectional view showing a light emitting device according to a sixth embodiment.

FIG. 10 is a side sectional view showing a light emitting device according to a sixth embodiment. In the following description of FIG. 10, the structure of the light emitting chip 120 and the support member 110 shown in FIG. 1 will be incorporated by references for the same parts of FIG. 10.

Referring to FIG. 10, the light emitting device includes a support member 110, a light emitting chip 120 on the support member 110 and an adhesive member 160 between the support member 110 and the light emitting chip 120.

The support member 110 may include a body 111, a protective layer 113 and first and second pads 115 and 117.

The light emitting chip 120 may include a substrate 121, a light emitting structure 125, electrode layers 141 and 142, insulating layers 131 and 133, a connection layer 143 and third and fourth pads 145 and 147.

The adhesive member 160 may include a conductive film, for instance, an electric conductive film. The conductive film may include at least one conductive particle 61 in an insulating film. The conductive particle 61, for example, may include at least one of a metal, a metal alloy and carbon. The conductive particle 61 may include at least one of Ni, Ag, Au, Al, Cr, Cu and C. The conductive particle 61 may include an anisotropic conductive film or an anisotropic conductive adhesive.

Hereinafter, the bonding process for the adhesive member 160 will be described with reference to FIG. 11. The adhesive member 160 is disposed between the light emitting chip 120 and the support member 110 and then the thermal pressing process is performed. Thus, the conductive particles 61 of the conductive film are distributed between the first and second pads 115 and 117 of the support member 110 and the third and fourth pads 145 and 147 of the light emitting chip 120. The conductive particles 61 make contact with the first and third pads 115 and 145 and the second and fourth pads 117 and 147. Thus, the first and third pads 115 and 145 are connected to each other by the conductive particles 61 and the second and fourth pads 117 and 147 are connected to each other by the conductive particles 61. Since the conductive particles 61 are distributed in mutually different regions, electric interference may not occur with respect to the pads 115, 117, 145 and 147.

The adhesive member 160 is bonded between the light emitting chip 120 and the support member 110. Due to the adhesive member 160, the light emitting chip 120 may be spaced apart from the support member 110 at a minimum interval of 2 μm or less. An interval between the first and third pads 115 and 145 and an interval between the second and fourth pads 117 and 147 may be smaller than a diameter of the conductive particle 61, for instance, 2 μm or less.

The adhesive member 160 may include protrusions 161 and 163, which are disposed in at least one of the first and second holes 11 and 13. For instance, the protrusions 161 and 163 are disposed in the first and second holes 11 and 13, respectively. The protrusions 161 and 163 may have a length smaller than a height of the first and second holes 11 and 13. The protrusions 161 and 163 disposed in the first and second holes 11 and 13 may come into contact with the third and fourth pads 145 and 147 of the light emitting chip 120. The protrusions 161 and 163 may overlap with the light emitting chip 120 in the vertical direction. The protrusions 161 and 163 may overlap with the third and fourth pads 145 and 147 in the vertical direction. The protrusions 161 and 163 may be configured to have a wider width of upper region than that of a lower region, but the embodiment of the invention is not limited thereto. The protrusions 161 and 163 may be spaced apart from each other in the support member 110.

An outer portion of the adhesive member 160 may be disposed outward as compared with a lateral side of the light emitting structure 125. The outer portion of the adhesive member 160 may be disposed at an outside of the third and fourth pads 145 and 147. A top surface of the outer portion of the adhesive member 160 may be lower than a bottom surface of the light emitting structure 125. The outer portion of the adhesive member 160 may overlap with an outer portion of the substrate 121 in the vertical direction.

According to the embodiment of the invention, the conductive adhesive member 160 is connected and bonded between the support member 110 having the body 111 of silicon material and the light emitting chip 120, so that heat generated from the light emitting chip 120 can be effectively conducted or dissipated.

Figure 11:
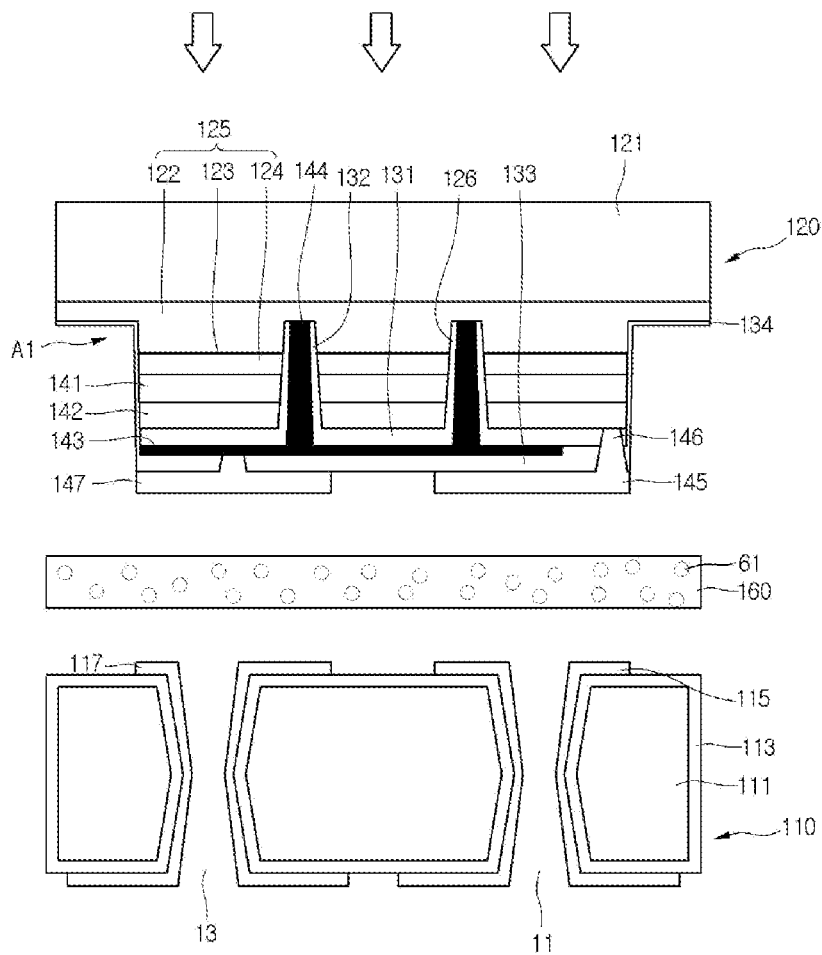
FIG. 11 is a view showing a manufacturing process of a light emitting device shown in FIG. 10.

As shown in FIGS. 10 and 11, after the adhesive member 160 is disposed on the support member 110, the light emitting chip 120 is pressed toward the support member 110. As a result, the conductive particles 61 are disposed between the first and second pads 115 and 117 of the support member 110 and between the third and fourth pads 145 and 147 of the light emitting chip 120 so that the support member 110 may be bonded to the light emitting chip 120. In this instance, a portion of the adhesive member 160 is moved while being pushed from the interfacial surface between the first and third pads 115 and 145 and the interfacial surface between the second and fourth pads 117 and 147, so that the adhesive member 160 is partially introduced into the first and second holes 11 and 13. In addition, the adhesive member 160 is moved into an outer region of the light emitting chip 120 and a region among the pads 115, 117, 145 and 147. As the adhesive member 160 is cured, the portion of the adhesive member 160 disposed in the first and second holes 11 and 13 of the support member 110 may form the protrusion. After that, the light emitting device may be cut into a package size or may be used for a lighting module having one or at least two light emitting chips 120.

The adhesive member 160 has the thickness in the range of 20 μm to 25 μm before the pressing process and the portion of the adhesive member 160 is completely removed from the interfacial surface among the pads 115, 117, 145 and 147 after the pressing process. In this instance, a space for receiving the adhesive member 160 is necessary at the region adjacent to the pads 115, 117, 145 and 147.

According to the embodiment of the invention, the holes 11 and 13 are formed in the region of the support member 110 adjacent to or overlapping with the pads 115 and 117 of the support member 110, so that the holes 11 and 13 may serve as a receiving space for the adhesive member 160 during the thermal pressing process for the adhesive member 160. Thus, an interval among the pads 115, 117, 145 and 147 can be more narrowed. A portion of the adhesive member 160 may move into a space between the support member 110 and the light emitting chip or an outer region of the light emitting chip 120.

As the adhesive member 160 is cured, the light emitting chip 120 is bonded to the support member 110. At this time, an interval between corresponding pads 115, 117, 145 and 147 may be less than 4 μm or may be in the range of 2 μm to 3 μm. That is, the conductive particles 61 making contact with the corresponding pads 115, 117, 145 and 147 may have the diameter in the range of 2 μm to 3 μm. The conductive particles 61 may have the diameter in the range of 4 μm to 6 μm before the pressing process. That is, the conductive particles 61 that do not make contact with the corresponding pads 115, 117, 145 and 147 may have the diameter in the range of 4 μm to 6 μm. The thickness of the other region of the adhesive member 160 may be equal to or more than 15 μm or equal to or more than 20 μm.

Figure 12:
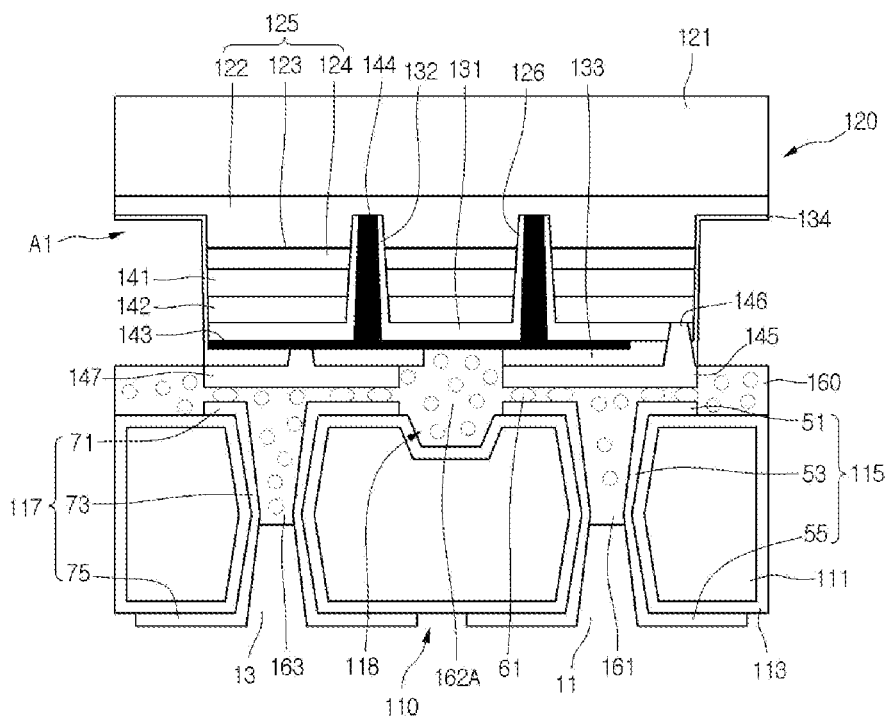
FIG. 12 is a side sectional view showing a light emitting device according to a seventh embodiment.

FIG. 12 is a side sectional view showing a light emitting device according to a seventh embodiment. In the following description of FIG. 12, the description of FIG. 10 will be incorporated by references for the same parts.

Referring to FIG. 12, the light emitting device includes a support member 110, a light emitting chip 120 on the support member 110 and an adhesive member 160 between the support member 110 and the light emitting chip 120.

The adhesive member 160 may include an electric conductive film. For instance, the adhesive member 160 may include a film having an insulating resin and conductive particles 61 added to the insulating resin.

A first recess 118 is formed at an upper portion of the support member 110. For instance, the support member 110 may include the first recess 119 recessed lower than a top surface of the body 111 below a region between the first and second pads 115 and 117. The first recess 118 may increase a receiving space at the region between the first and third pads 115 and 145 and between second and fourth pads 117 and 147. Thus, as the adhesive member 160 is moved, a portion 162 of the adhesive member 160 is filled in the first recess 118. In addition, a portion of the second insulating layer 133 is open at a region below the light emitting chip 120 so that the connection layer 143 may be exposed, but the embodiment of the invention is not limited thereto. The open region of the second insulating layer 133 may serve as a recess into the portion 162 of the adhesive member 160 is filled. In another example, a portion of the connection layer 143 may be open at a region below the light emitting chip 120 to form a second recess 128 as shown in FIG. 6.

Figure 13:
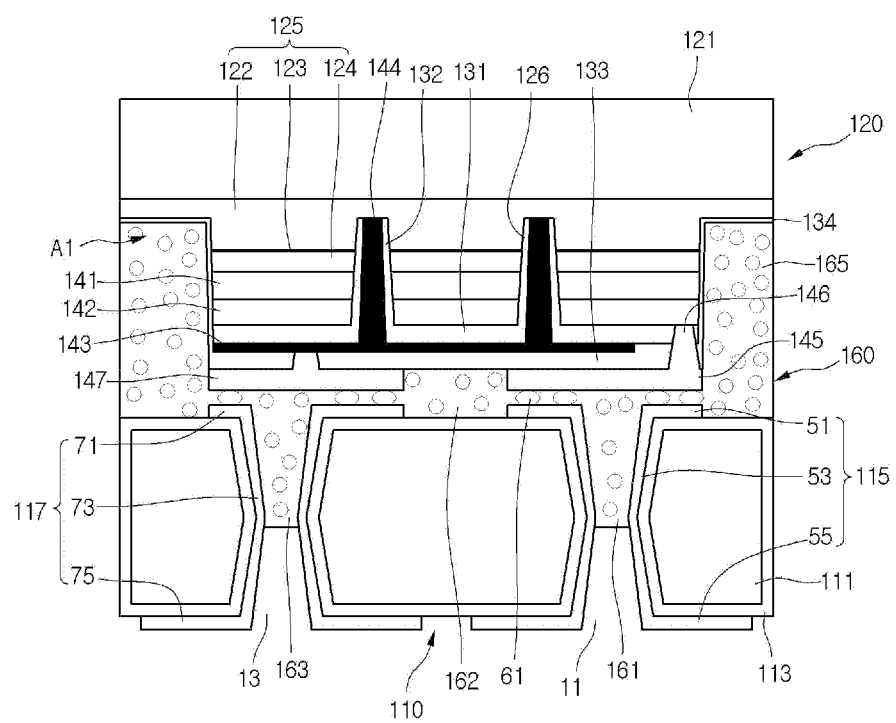
FIG. 13 is a side sectional view showing a light emitting device according to an eighth embodiment.

FIG. 13 is a side sectional view showing a light emitting device according to an eighth embodiment. In the following description of FIG. 13, the description of FIG. 10 will be incorporated by references for the same parts.

Referring to FIG. 13, an outer portion 165 of the adhesive member 160 may extend outward of the light emitting structure 125. For example, the outer portion 165 of the adhesive member 160 may extend to the outer surfaces of the second conductive semiconductor layer 124, the active layer 123, and the first conductive semiconductor layer 122. Thus, the outer portion 165 of the adhesive member 160 may protect the outer surface of the light emitting structure 125. If there is no second insulating layer 133 at the outer surface of the light emitting structure 125, the outer portion 165 of the adhesive member 160 may come into contact with the outer surface of the light emitting structure 125.

According to the embodiment of the invention, a recess region having a stepped structure is disposed at the outer region of the light emitting structure 125, so the outer portion 165 of the adhesive member 160 may be received in the recess region. Thus, when the adhesive member 160 is thermally pressed, the adhesive member 160 can be prevented from protruding outward more than the lateral side of the support member. In addition, since the adhesive member 160 is disposed at the outer surface of the light emitting structure 125, the moisture can be prevented from penetrating into the light emitting structure 125.

Figure 14:
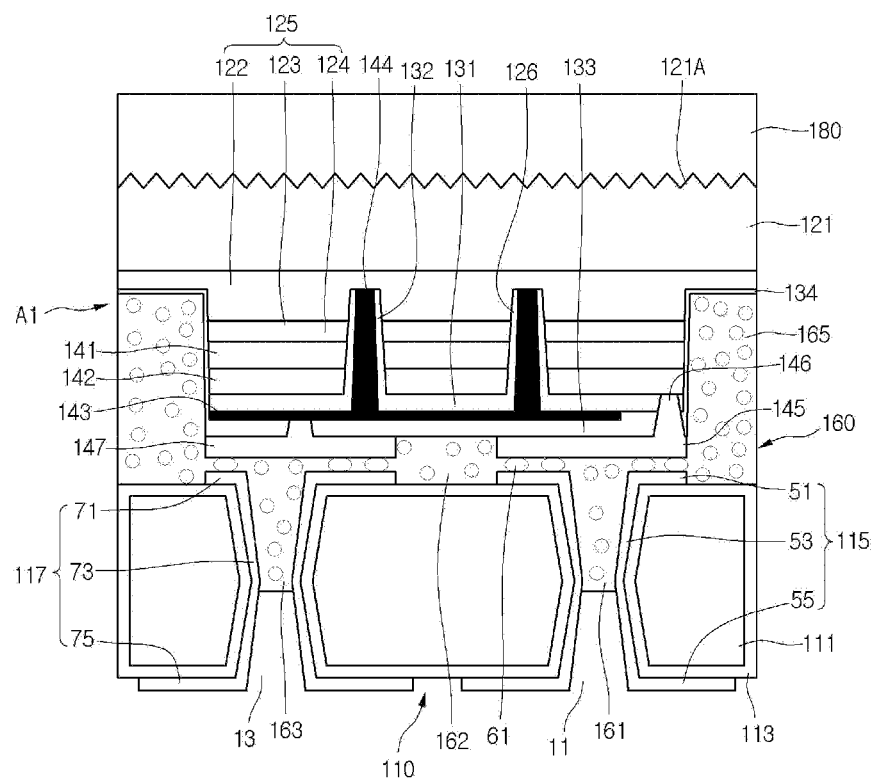
FIG. 14 is a side sectional view showing a light emitting device according to a ninth embodiment.

FIG. 14 is another example of FIG. 13. Referring to FIG. 14, a roughness pattern 121A may be formed on the top surface of the substrate 121 of the light emitting chip 120 for light extraction. The roughness pattern 121A may improve the extraction efficiency of the light passing through the substrate 121. A resin layer 180 may be formed on the substrate 121. The resin layer 180 may be prepared as a single layer or a multiple layer. The resin layer 180 may include impurity such as a phosphor. A lens having a curvature may be coupled onto the resin layer 180.

Figure 15:
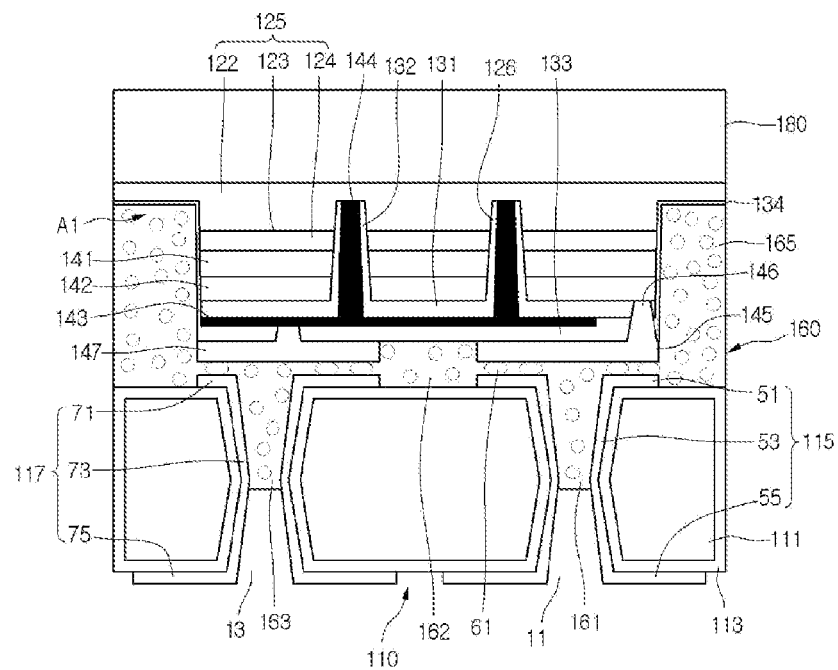
FIG. 15 is a side sectional view showing a light emitting device according to a tenth embodiment.

FIG. 15 is another example of FIG. 13. Referring to FIG. 15, the substrate 121 may be removed from the light emitting chip 120 of the light emitting device and a semiconductor layer may be exposed on a top surface of the light emitting chip 120. The semiconductor layer may be the light emitting structure 125, for instance, the first conductive semiconductor layer 122. The semiconductor layer may be a buffer layer or an undoped semiconductor layer, but the embodiment of the invention is not limited thereto. The resin layer 180 or the roughness pattern may be formed on the light emitting structure 125.

Meanwhile, a volume of the receiving space for receiving the adhesive member 150 or 160 in the support member 110 according to the embodiment of the invention may be provided as follows. The receiving space is provided in the light emitting chip 120 or the support member 110 to receive the adhesive member 150 or 160 and may be defined by the first and second holes 11 and 13 or the first and second recesses 118 and 128. The receiving space may have a volume sufficient for allowing the adhesive member 150 or 160 to move therein. When the light emitting chip 120 has a size of 1 mm×1 mm, a ratio of the volume of the receiving space to a top surface area of the first pad 115 or the second pad 117 may be in the range of 380:1 to 420:1. In addition, a ratio of the volume of the receiving space to the sum of top surface areas of the first pad 115 and the second pad 117 may be in the range of 190:1 to 210:1. The volume of the holes 11 and 13 may be provided in proportional to the predetermined magnification of the top surface areas of the first and second pads 115 and 117 of the support member 110.

Table 1 shows the volume of the receiving space and the top surface areas of the first and second pads 115 and 117 in the support member 110. In this instance, the support member 110 may have the thickness in the range of 180 μm to 210 μm, and the thickness of the adhesive member 150 or 160 before the pressing process has been changed from 10 μm to 30 μm.

TABLE 1

| Volume of receiving space (μm³) | Top surface area of first pad (μm²) | Top surface area of second (μm²) |
|---|---|---|
| 8,000,000 | 20000 | 20000 |
| 9,000,000 | 22500 | 22500 |
| 10,000,000 | 25000 | 25000 |
| 11,000,000 | 27500 | 27500 |
| 12,000,000 | 30000 | 30000 |
| 13,000,000 | 32500 | 32500 |
| 14,000,000 | 35000 | 35000 |
| 15,000,000 | 37500 | 37500 |
| 16,000,000 | 40000 | 40000 |
| 17,000,000 | 42500 | 42500 |
| 18,000,000 | 45000 | 45000 |
| 19,000,000 | 47500 | 47500 |
| 20,000,000 | 50000 | 50000 |
| 21,000,000 | 52500 | 52500 |
| 22,000,000 | 55000 | 55000 |
| 23,000,000 | 57500 | 57500 |
| 24,000,000 | 60000 | 60000 |
| 25,000,000 | 62500 | 62500 |
| 26,000,000 | 65000 | 65000 |
| 27,000,000 | 67500 | 67500 |
| 28,000,000 | 70000 | 70000 |

Figure 16:
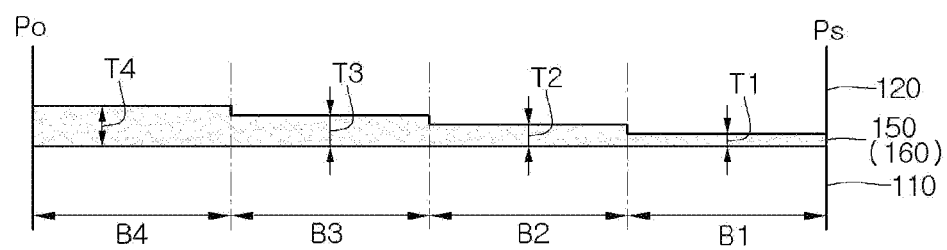
FIG. 16 is a view for explaining thickness variation of an adhesive member in each area when a support member has no hole in the process of manufacturing a light emitting device.

When the resin of the adhesive member 150 or 160 is moved due to the thermal pressing process, the volume of the holes 11 and 13 may be provided by taking into consideration the area of the first and second pads 115 and 117 and the thickness of the adhesive member 150 or 160 before the thermal pressing process. If the volume of the holes 11 and 13 is less than the above range or the holes 11 and 13 are omitted, the conductive particles 61 of the adhesive member 160 arranged at the regions between the first and third pads 115 and 145 and between the second and fourth pads 117 and 147 may not be pressed. For example, as shown in FIG. 16, the thickness T1, T2, T3 and T4 of the adhesive member 150 or 160 may become gradually increased from an edge Ps to a center Po of the light emitting chip 120 as indicated by regions B1, B2, B3 and B4. An edge Ps of the adhesive member 150 or 160 may become thin because there is a space for the movement of the adhesive member 150 or 160 and a center Po of the adhesive member 150 or 160 may be thicker than the edge region B1 because there is no space for the movement of the adhesive member 150 or 160. If the thickness T4 of the center Po becomes thicker than the diameter of the conductive particle 61 of the adhesive member 160 as shown in FIG. 11, the electric connection between the first and third pads 115 and 145 and between the second and fourth pads 117 and 147 may be blocked. In addition, if the thickness T4 of the center Po becomes thicker, the adhesive member 150 shown in FIG. 1 may remain at the regions between the first and third pads 115 and 145 and between the second and fourth pads 117 and 147, so contact failure may occur between the first and third pads 115 and 145 and between the second and fourth pads 117 and 147. In another example, when the first and second holes 11 and 13 and the first recess 118 are simultaneously provided in the support member 110, the volume of the holes 11 and 13 can be reduced by taking the volume of the first recess 118 into consideration.

In the support member 110 according to the embodiment of the invention, the receiving space, such as the holes 11 and 13, the first recess 118 or the second recess 128, is provided in the region adjacent to or overlapping with the first and second pads 115 and 117, so that the adhesive member 150 or 160 can be received in the receiving space as the adhesive member 150 or 160 is moved during the thermal pressing process. In this instance, the adhesive member 150 or 160 filled in the holes 11 and 13 may form the protrusion and the electric connection may be enabled between the first and third pads 115 and 145 and between the second and fourth pads 117 and 147.

Figure 17:
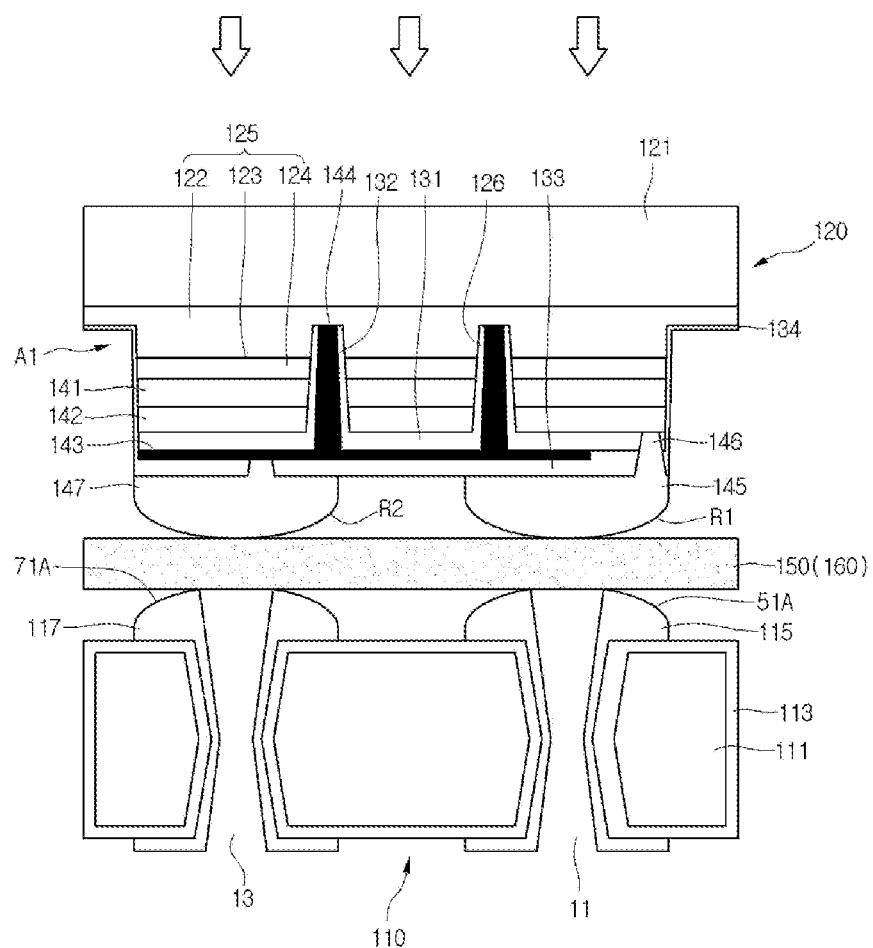
FIGS. 17 and 18 are views for explaining a pressing process for a lighting emitting chip and pads of a support substrate by using pressing members having mutually different shapes according to an embodiment.

FIG. 17 is a view showing another example of a manufacturing process for a light emitting device.

Referring to FIG. 17, the adhesive member 150 or 160 is disposed between the support member 110 and the light emitting chip 120 of the light emitting device.

The adhesive member 150 or 160 may include the electric conductive adhesive film or the electric insulating adhesive film.

The first and second pads 115 and 117 of the support member 110 may include curved structures 51A and 71A having convex-up top surfaces. The third and fourth pads 145 and 147 of the light emitting chip 120 may include curved structures R1 and R2 having convex-down bottom surfaces. The first to fourth pads 115, 117, 145 and 147 may have semicircular sectional shapes.

As the adhesive member 150 or 160 is thermally pressed toward the support member 110 by the light emitting chip 120, the third and fourth pads 145 and 147 of the light emitting chip 120 make contact with the first and second pads 115 and 117 of the support member 110 due to the curved structures 51A and 71A or make contact with the conductive particles 61 as shown in FIG. 10. That is, the adhesive member 150 or 160 can be effectively pressed due to the curved structures 51A/R1 and 71A/R2 which correspond to each other. Then, the first and third pads 115 and 145 and the second and fourth pads 117 and 147 may be bonded with each other or may be bonded with the conductive particles by passing through the adhesive member 150 or 160. Bottom surfaces of the first and third pads 115 and 145 and the second and fourth pads 117 and 147 may have the curved structures 51A and 71A and R1 and R2 or may have flat structures, and the embodiment of the invention is not limited thereto.

Figure 18:
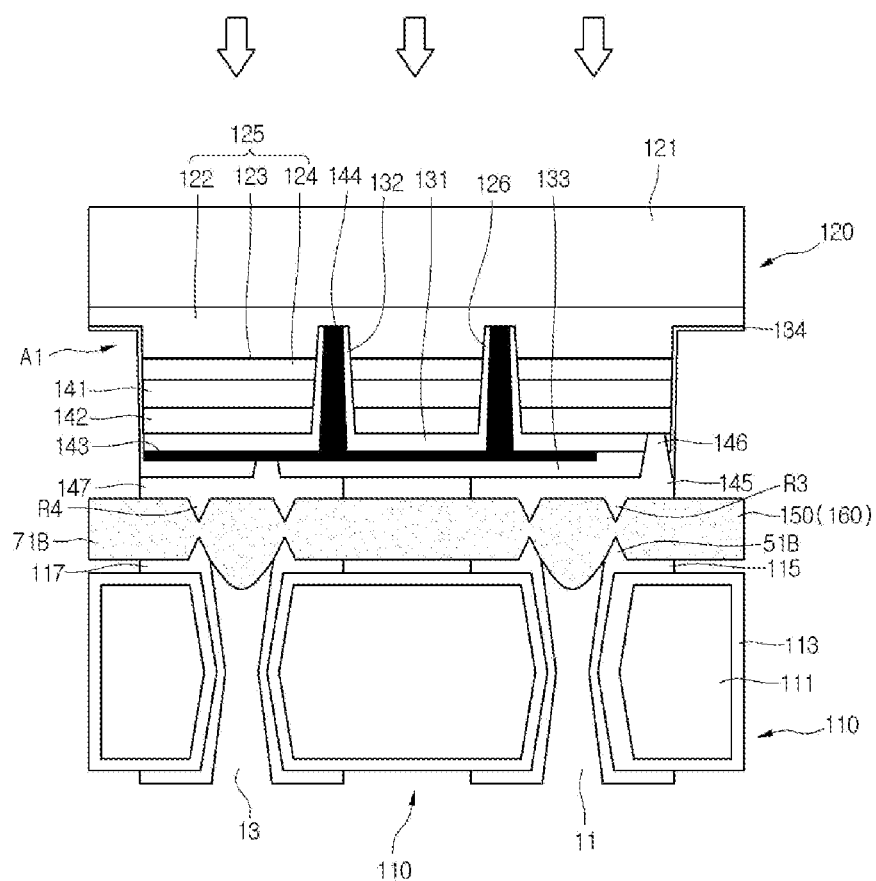

FIG. 18 shows another example of a light emitting device.

Referring to FIG. 18, the first and third pads 115 and 145 of the support member 110 may include protrusions 51B and 71B having convex-up top surfaces and the third and fourth pads 145 and 147 of the light emitting chip 120 may include protrusions R3 and R4 having convex-down bottom surfaces. Each of the pads 115, 117, 145 and 147 may have a plurality of protrusions 51B and 71B and R3 and R4, but the embodiment of the invention is not limited thereto. The protrusions 51B and 71B and R3 and R4 may have triangular or polygonal sectional shapes. After the bonding is completed, the bottom surfaces of the first and second pads 115 and 117 and the bottom surfaces of the third and fourth pads 145 and 147 may have the shapes of 51B and 71B and R3 and R4 or may have the flat shapes, but the embodiment of the invention is not limited thereto.

Figure 19:
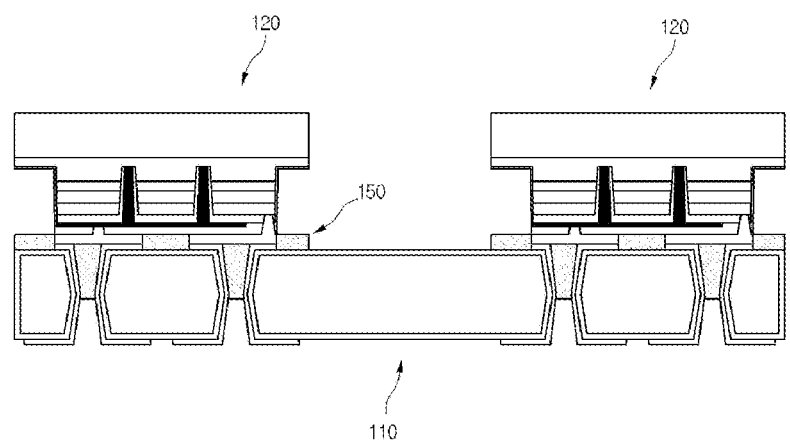
FIG. 19 is a side sectional view showing a light emitting device according to an eleventh embodiment.

FIG. 19 is a side sectional view showing a light emitting device according to an eleventh embodiment.

Referring to FIG. 19, a plurality of light emitting chips 120 are arranged on the support member 110 and the adhesive member 150 according to the embodiment of the invention may be disposed between the support member 110 and each light emitting chip 120. A portion of the adhesive member 150 may protrude into the hole of the support member 110. In other example, the adhesive member 150 may include a conductive film having conductive particles.

Figure 20:
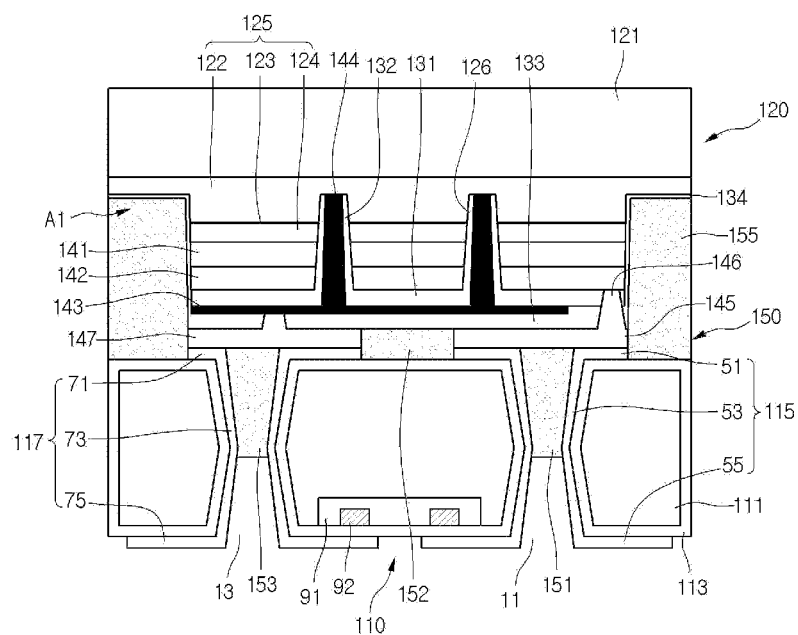
FIG. 20 is a side sectional view showing a light emitting device according to a twelfth embodiment.

FIG. 20 is a side sectional view showing a light emitting device according to a twelfth embodiment. In the following description of FIG. 20, the previous description will be incorporated by references.

Referring to FIG. 20, the support member 110 includes the body 111, such as a conductive body. The conductive body 111 may include silicon and may be formed therein with n-type impurity or p-type impurity. One or a plurality of impurity areas 91 and 92, such as a p-type impurity area and an n-type impurity area, may be formed in the body. The impurity areas 91 and 92 may be selectively connected to the first and second pads 115 and 117 of the support member 110. The impurity areas 91 and 92 may be implemented as a device having a p-n junction area and a p-n-p junction area. The device may serve as a component, such as a diode, a TFT, a zener diode, a bridge diode, an IC driver or a resistor. Such a device may be implemented as a circuit to control the operation of one or a plurality of light emitting devices.

In addition, in the support member 110, the impurity areas 91 and 92 may be disposed at a lower portion of the body 111 spaced apart from the light emitting chip 120 or at an upper portion of the body 111 adjacent to the light emitting chip 120.

The embodiments of the invention provide the light emitting device having a new heat dissipation structure. The embodiments of the invention provide the light emitting device having a new electric connection structure. According to the embodiment of the invention, the light emitting chip can be bonded onto the support member by the adhesive member. According to the embodiment of the invention, the support member can be electrically connected to the light emitting chip by using the adhesive member. According to the embodiment of the invention, the light emitting device and the light unit having the same may have the improved reliability.

A plurality of light emitting devices according to the above embodiment(s) may be arranged on a printed circuit board (PCB) so as to be used for the lighting system, such as a light emitting module or a light unit. In the light emitting module, the light emitting devices are arrayed on the PCB which may be a substrate having a circuit layer. The light unit may include at least one of a light guide plate, a diffusion sheet and a prism sheet at a light exit side of the light emitting device according to the embodiment. The lighting system may include a lighting lamp, a signal lamp, a headlight of a vehicle or an electric signboard.

Any reference in this specification to "one embodiment," "an embodiment," "example embodiment," etc., means that a particular feature, structure, or characteristic described in connection with the embodiment of the invention is included in at least one embodiment of the invention. The appearances of such phrases in various places in the specification are not necessarily all referring to the same embodiment. Further, when a particular feature, structure, or characteristic is described in connection with any embodiment of the invention, it is submitted that it is within the purview of one skilled in the art to affect such feature, structure, or characteristic in connection with other ones of the embodiments.

Although embodiments of the invention have been described with reference to a number of illustrative embodiments thereof, it should be understood that numerous other modifications and embodiments of the invention can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a support member having a body, first and second pads spaced apart from each other on the body, and a depression in the body;
   a light emitting chip having a light emitting structure and third and fourth pads under the light emitting structure; and
   an adhesive member between the support member and the light emitting chip,
   wherein the third pad is electrically connected to the first pad,
   wherein the fourth pad is electrically connected to the second pad,
   wherein the light emitting structure includes a first conductive semiconductor layer, an active layer and a second conductive semiconductor layer,
   wherein a portion of the adhesive member is disposed in the depression,
   wherein the depression includes a plurality of holes,
   wherein a first hole of the plurality of holes vertically overlaps with the third pad of the light emitting chip,
   wherein a second hole of the plurality of holes vertically overlaps with the fourth pad of the light emitting chip,
   wherein the first pad includes a first contact part on the body, a first bonding part under the body and a first connection part disposed in the first hole to connect the first contact part to the first bonding part,
   wherein the second pad includes a second contact part on the body, a second bonding part under the body and a second connection part disposed in the second hole to connect the second contact part to the second bonding part,
   wherein the adhesive member includes an insulating film,
   wherein the first pad contacts the third pad,
   wherein the second pad contacts the fourth pad,
   wherein the depression further includes a recess disposed at a region between the first and second pads and is recessed lower than a first surface of the body,
   wherein a portion of the adhesive member is disposed in the recess of the depression.

2. The light emitting device of claim 1, wherein at least one of the plurality of holes of the depression is formed through the body.

3. The light emitting device of claim 1, wherein the depression further includes a plurality of depressions including:
   a first depression, which is a hole that is formed through the body from a first surface of the body to a second surface of the body, the first surface being a surface facing the light emitting chip, and
   a second depression, which is a concave portion formed on the first surface of the body.

4. The light emitting device of claim 3, wherein a conductor is formed on the first surface, the second surface and an interior of the hole that is formed through the body, to form an electrical connection from the first surface to the second surface.

5. The light emitting device of claim 1, wherein the adhesive member includes an insulating film having conductive particles, and
   wherein the conductive particles are disposed at a region between the first and third pads and at a region between the second and fourth pads.

6. The light emitting device of claim 5, wherein the conductive particles are in contact with the first and third pads and the second and fourth pads.

7. The light emitting device of claim 5, wherein the light emitting chip further includes:
   a first electrode layer under the light emitting structure;
   a second electrode layer disposed under the first electrode layer to reflect light;
   a first insulating layer under the second electrode layer;
   a connection layer disposed under the first insulating layer and connected to the first conductive semiconductor layer; and
   a second insulating layer under the connection layer,
   wherein the third pad is connected to the second electrode layer through the second insulating layer, and
   wherein the fourth pad is connected to the connection layer through the second insulating layer.

8. The light emitting device of claim 7, wherein the light emitting chip further includes a recess disposed at a region adjacent to the third and fourth pads and recessed to have a depth for exposing at least one of the connection layer, the first insulating layer and the second electrode layer from the second insulating layer, and
   a portion of the adhesive member is disposed in the recess of the light emitting chip.

9. The light emitting device of claim 7, wherein an outer portion of the adhesive member is disposed at an outer surface of the light emitting structure.

10. The light emitting device of claim 9, wherein the second insulating layer extends into a region between the outer portion of the adhesive member and the outer surface of the light emitting structure.

11. The light emitting device of claim 1, wherein the first and second holes have widths gradually narrowed toward a center between a first surface and a second surface of the support member.

12. The light emitting device of claim 1, wherein an outer portion of the light emitting structure includes a stepped structure, and
   an outer portion of the first conductive semiconductor layer, which is disposed on the stepped structure, overlaps with an outer region of the adhesive member in a vertical direction.

13. A light emitting device comprising:
   a support member having a body, first and second pads spaced apart from each other on the body, and a depression in the body;
   a light emitting chip having a light emitting structure and third and fourth pads under the light emitting structure; and
   an adhesive member between the support member and the light emitting chip,
   wherein the third pad is electrically connected to the first pad,
   wherein the fourth pad is electrically connected to the second pad,
   wherein the light emitting structure includes a first conductive semiconductor layer, an active layer and a second conductive semiconductor layer,
   wherein a portion of the adhesive member is disposed in the depression, wherein the depression includes a plurality of holes,
wherein a first hole of the plurality of holes vertically overlaps with the third pad of the light emitting chip,
wherein a second hole of the plurality of holes vertically overlaps with the fourth pad of the light emitting chip,
wherein the first pad includes a first contact part on the body, a first bonding part under the body and a first connection part disposed in the first hole to connect the first contact part to the first bonding part,
wherein the second pad includes a second contact part on the body, a second bonding part under the body and a second connection part disposed in the second hole to connect the second contact part to the second bonding part,
wherein the adhesive member includes an insulating film,
wherein the first pad contacts the third pad,
wherein the second pad contacts the fourth pad,
wherein the light emitting chip further includes:
  a first electrode layer under the light emitting structure;
  a second electrode layer disposed under the first electrode layer to reflect light;
  a first insulating layer under the second electrode layer;
  a connection layer disposed under the first insulating layer and connected to the first conductive semiconductor layer; and
  a second insulating layer under the connection layer,
wherein the third pad is connected to the second electrode layer through the second insulating layer, and
wherein the fourth pad is connected to the connection layer through the second insulating layer.

14. The light emitting device of claim 13, wherein the light emitting chip further includes a recess disposed at a region adjacent to the third and fourth pads and recessed to have a depth for exposing at least one of the connection layer, the first insulating layer and the second electrode layer from the second insulating layer, and
  wherein a portion of the adhesive member is disposed in the recess of the light emitting chip.

15. The light emitting device of claim 13, wherein an outer portion of the adhesive member is disposed at an outer surface of the light emitting structure.

16. The light emitting device of claim 15, wherein the second insulating layer extends into a region between the outer portion of the adhesive member and the outer surface of the light emitting structure.

17. The light emitting device of claim 13, further comprising at least one of a transparent substrate, a resin layer and a lens on the light emitting structure.

18. The light emitting device of claim 13, wherein the support member includes a protective layer disposed between the body of a conductive material and the first and second pads, and
  the body of the conductive material includes a silicon having impurity regions different from each other.

19. A light emitting device comprising:
  a support member having a body, first and second pads spaced apart from each other on the body and a hole in the body;
  a light emitting chip having a light emitting structure and third and fourth pads under the light emitting structure; and
  an adhesive member between the support member and the light emitting chip,
  wherein the third pad on the body is electrically connected to the first pad of the light emitting structure,
  wherein the fourth pad on the body is electrically connected to the second pad under the light emitting structure,
  wherein the light emitting structure includes a first conductive semiconductor layer, an active layer and a second conductive semiconductor layer,
  wherein the adhesive member includes a protrusion protruding into the hole,
  wherein the hole includes a plurality of holes,
  wherein a first hole of the plurality of holes vertically overlaps with the third pad of the light emitting chip,
  wherein a second hole of the plurality of holes vertically overlaps with the fourth pad of the light emitting chip,
  wherein the protrusion is disposed in each of the first and second holes and has a height smaller than a depth of the first and second holes,
  wherein each of the first and second holes is an open region which is formed by vertically passing through an interior of the support member, and
  wherein the first and second holes have widths gradually narrowed toward a center of the body than a top surface and a bottom surface of the body.

20. The light emitting device of claim 19, wherein a lower width of the first and second holes is larger than a width of the first and the second holes at a center region of the body, and
  wherein when viewed from a top, the first and second holes have a polygonal shape.

21. The light emitting device of claim 20, wherein the first pad includes a first contact part on the body, a first bonding part under the body and a first connection part disposed in the first hole to connect the first contact part to the first bonding part, and
  wherein the second pad includes a second contact part on the body, a second bonding part under the body and a second connection part disposed in the second hole to connect the second contact part to the second bonding part.

22. The light emitting device of claim 21, wherein the adhesive member includes an insulating film,
  wherein the first pad contacts the third pad, and
  wherein the second pad contacts the fourth pad.

* * * * *